United States Patent
Lim et al.

(10) Patent No.: US 10,522,070 B2
(45) Date of Patent: Dec. 31, 2019

(54) CONVERTER AND DISPLAY APPARATUS INCLUDING THE SAME

(71) Applicant: Samsung Display Co., Ltd., Yongin-si (KR)

(72) Inventors: Woon Yong Lim, Hwaseong-si (KR); Sung Soo Choi, Anyang-si (KR); Ki Hyun Pyun, Gwangmyeong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 9 days.

(21) Appl. No.: 15/802,118

(22) Filed: Nov. 2, 2017

(65) Prior Publication Data

US 2018/0122293 A1 May 3, 2018

(30) Foreign Application Priority Data

Nov. 3, 2016 (KR) .......................... 10-2016-0146021

(51) Int. Cl.
*G09G 3/20* (2006.01)
*H03K 7/08* (2006.01)
*H03L 7/08* (2006.01)

(52) U.S. Cl.
CPC ............ *G09G 3/2092* (2013.01); *G09G 3/20* (2013.01); *G09G 2310/06* (2013.01); *G09G 2310/08* (2013.01); *G09G 2320/0209* (2013.01); *G09G 2330/021* (2013.01); *G09G 2330/028* (2013.01); *G09G 2330/06* (2013.01); *G09G 2360/16* (2013.01); *H03K 7/08* (2013.01); *H03L 7/08* (2013.01)

(58) Field of Classification Search
None
See application file for complete search history.

(56) References Cited

U.S. PATENT DOCUMENTS

2004/0150660 A1* 8/2004 Abe ..................... G09G 3/2081
345/691

FOREIGN PATENT DOCUMENTS

| KR | 100609056 | 8/2006 |
|---|---|---|
| KR | 1020110090302 | 8/2011 |
| KR | 1020160048314 | 5/2016 |
| KR | 1020160080291 | 7/2016 |

* cited by examiner

*Primary Examiner* — Nicholas J Lee
(74) *Attorney, Agent, or Firm* — Cantor Colburn LLP

(57) ABSTRACT

A converter includes a phase locked loop ("PLL") unit which outputs a first frequency signal having a first frequency during a first period of one frame and to output a second frequency signal modulated to have a frequency corresponding to a pattern of an image signal during a second period other than the first period, a pulse width modulation ("PWM") signal generator which generates a PWM signal according to the frequency of the frequency signal outputted from the PLL unit, and a voltage generator which outputs a driving voltage obtained by modulating an input voltage in response to the PWM signal to a voltage output terminal.

9 Claims, 4 Drawing Sheets

CONVERTER AND DISPLAY APPARATUS INCLUDING THE SAME

This application claims priority to Korean Patent Application No. 10-2016-0146021, filed on Nov. 3, 2016, and all the benefits accruing therefrom under 35 U.S.C. § 119, the content of which in its entirety is herein incorporated by reference.

BACKGROUND

(a) Field

Exemplary embodiments of the invention relate to a converter and a display device including the same.

(b) Description of the Related Art

A display device generally includes a display panel in which a plurality of pixels, a plurality of gate lines, and a plurality of data lines are disposed, a gate driver outputting a gate signal to the gate lines, and a data driver outputting a data voltage to the data lines.

The display device generally includes a converter for stepping a power supply voltage up or down to supply a desired constant voltage in order to generate a driving voltage for driving the gate driver and the data driver. In general, the converter is operated according to a pulse width modulation ("PWM") signal having a constant frequency to generate a driving signal. A level of the driving voltage is controlled according to an on-pulse width of the PWM signal. A switching frequency of the converter may depend on the frequency of a pulse width modulation signal, and may determine power consumption, efficiency, etc. of the converter.

SUMMARY

In a conventional display device, since a switching frequency of a conventional converter is fixed, it is difficult to cope with a change in a load.

Exemplary embodiments have been made in an effort to provide a converter that is adaptively operated depending on a load condition, and a display device including the same. Exemplary embodiments have been made in an effort to provide a converter that may adjust an output voltage in real time in response to a specific pattern of an image, and a display device including the same.

An exemplary embodiment provides a converter including a phase locked loop ("PLL") unit which outputs a first frequency signal having a first frequency during a first period of one frame and outputs a second frequency signal modulated to have a frequency corresponding to a pattern of an image signal during a second period other than the first period, a pulse width modulation ("PWM") signal generator which generates a PWM signal according to the frequency of the frequency signal outputted from the PLL unit, and a voltage generator which outputs a driving voltage obtained by modulating an input voltage in response to the PWM signal to a voltage output terminal.

In an exemplary embodiment, the PLL unit may determine the first period and the second period by receiving a vertical synchronization signal and information related to a predetermined time period after a time when the vertical synchronization signal is changed to a disable level.

In an exemplary embodiment, a load condition fluctuation degree of the voltage output terminal in the first period may be larger than that of the voltage output terminal in the second period.

In an exemplary embodiment, the PLL unit may output a third frequency signal having a third frequency modulated to correspond to a pattern of a first image signal during a second period of a first frame period and may output a fourth frequency signal having a fourth frequency modulated to correspond to a pattern of the second image signal during a second period of a second frame period subsequent to the first frame period, where the fourth frequency is different from the third frequency.

In an exemplary embodiment, the pattern of the image signal may be determined depending on a data toggle number in the image signal.

In an exemplary embodiment, the second frequency may be equal to or smaller than the first frequency.

In an exemplary embodiment, an exemplary embodiment provides a display device including a display panel which includes a plurality of pixels, a plurality of data lines, and a plurality of gate lines, a data driver which supplies data signals to the plurality of data lines, respectively, a gate driver which supplies gate signals to the plurality of gate lines, respectively, a voltage-generating controller which generates a driving voltage of the data driver and a driving voltage of the gate driver by modulating an input voltage in response to a PWM signal, and a signal controller which controls a frequency of the PWM signal to a first frequency during a first period of one frame period, and controls the frequency of the PWM signal to a second frequency corresponding to a pattern of an image signal during a second period other than the first period of the one frame period.

In an exemplary embodiment, the voltage-generating controller may include a PLL unit which outputs a first frequency signal having the first frequency during the first period and outputs a second frequency signal having the second period during the second period, a PWM signal generator which generates the PWM signal according to the first frequency signal or the second frequency signal, and a voltage generator which outputs a driving voltage obtained by modulating an input voltage in response to the PWM signal.

In an exemplary embodiment, the signal controller may transmit a vertical synchronization signal and information related to a predetermined time period after a time when the vertical synchronization signal is changed to a disable level, to the voltage-generating controller.

In an exemplary embodiment, the PLL unit may determine the first period and the second period by receiving the vertical synchronization signal and the information related to the predetermined time period.

In an exemplary embodiment, the gate driver and the data driver may start their operations during the first period.

In an exemplary embodiment, the gate driver and the data driver may stop their operations during the first period.

In an exemplary embodiment, the signal controller may detect a data toggle number in an image signal of the one frame period, and may increase the second frequency when the data toggle number is increased.

In an exemplary embodiment, the second frequency may be equal to or smaller than the first frequency. The data driver may generate a data signal of the data signals by a reference gamma voltage generated by dividing a driving voltage of the data driver.

In an exemplary embodiment, the driving voltage of the data driver may include a gate-on voltage and a gate-off voltage, and the gate driver may output a gate signal of the gate signals generated by a combination of the gate-on voltage and the gate-off voltage.

According to the exemplary embodiments, ripple generation of the driving voltage maybe suppressed.

According to the exemplary embodiments, display quality of the display device maybe improved.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
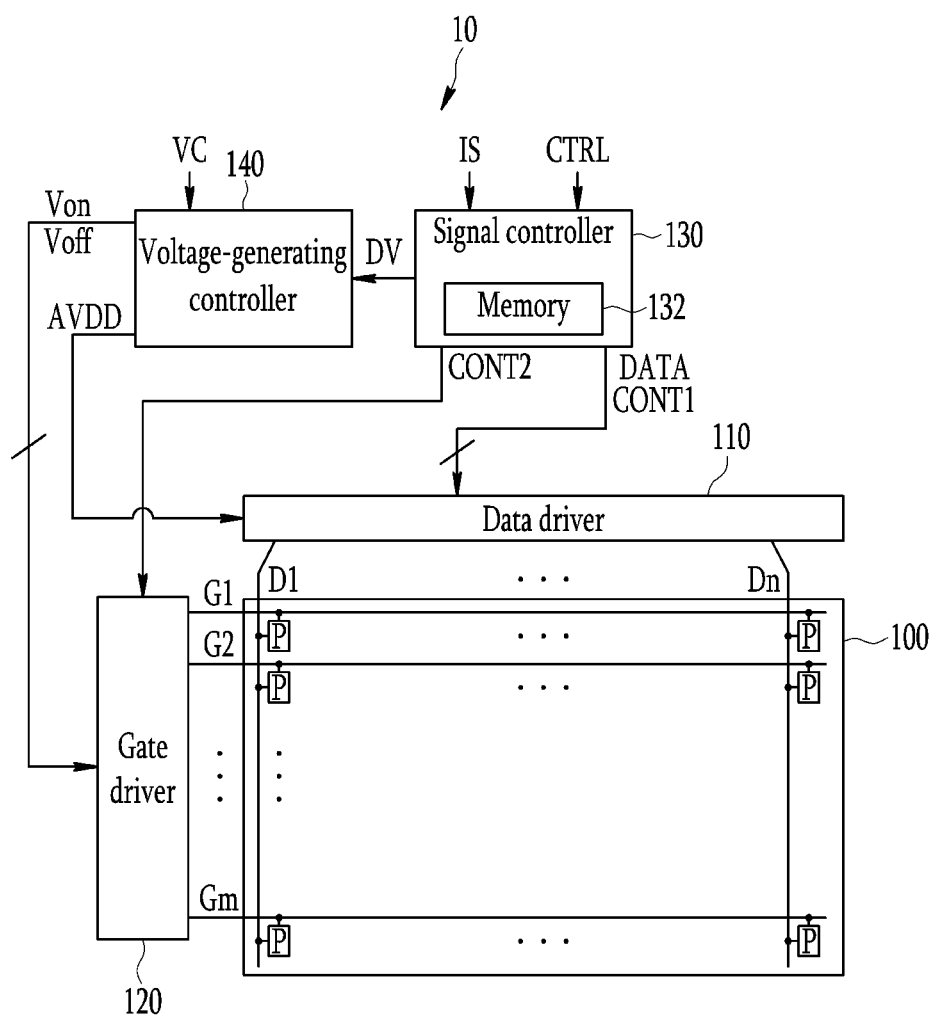
FIG. 1 is a block diagram illustrating an exemplary embodiment of a display device.

The invention will be described more fully hereinafter with reference to the accompanying drawings, in which exemplary embodiments are shown. As those skilled in the art would realize, the described embodiments may be modified in various different ways, all without departing from the spirit or scope.

To clearly describe the invention, parts that are irrelevant to the description are omitted, and like numerals refer to like or similar constituent elements throughout the specification.

In addition, unless explicitly described to the contrary, the word "comprise" and variations such as "comprises" or "comprising" will be understood to imply the inclusion of stated elements but not the exclusion of any other elements.

It will be understood that when an element is referred to as being "on" another element, it can be directly on the other element or intervening elements can be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," may therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

A display device 10 according to an exemplary embodiment will be described with reference to FIG. 1.

FIG. 1 is a block diagram illustrating a display device according to an exemplary embodiment. As illustrated therein, the display device 10 includes a display panel 100, a data driver 110, a gate driver 120, a signal controller 130, and a voltage-generating controller 140. The display device described herein may have more constituent elements than those listed above. In an exemplary embodiment, the voltage-generating controller 140 may include a converter.

First, the display panel 100 includes a plurality of display signal lines and a plurality of pixels P connected thereto. The display signal lines include a plurality of gate lines G1-Gm for transferring gate signals (also referred to as "scanning signals") and a plurality of data lines D1-Dn for transferring data voltages where m and n are natural numbers greater than one. Each of the pixels P may be connected to a corresponding gate line G1-Gm and a corresponding data line D1-Dn. The pixels P may include a liquid crystal display element or an organic light emitting element.

The data driver 110 is connected to the data lines D1-Dn of the display panel 100 to apply a plurality of data voltages to the data lines D1-Dn. The data driver 110 may include a plurality of data driving integrated circuits ("ICs") (not illustrated). The data driving ICs may be connected to the corresponding data lines.

Specifically, the data driving ICs may generate data voltages for all grays by reference gamma voltages generated by dividing a driving voltage AVDD. The data driving IC generates a data voltage by a data control signal CONT1 and inputted image data DATA, and outputs the generated data voltage as a data signal to the data lines.

The gate driver 120 is connected with the gate lines G1-Gm to apply a gate signal generated by a combination of a gate-on voltage Von and a gate-off voltage Voff, to all the gate lines G1 to Gm.

The gate driver 120 applies the gate-on voltage Von to all the gate lines G1 to Gm in units of one horizontal period (referred to as "1H" and identical to one period of a horizontal synchronizing signal and a data enable signal) based on a gate control signal CONT2, and the driving thereof is started by a scan start signal STV (refer to FIG. 3) included in the gate control signal CONT2. The data driver 110 applies a plurality of data voltages to all the pixels P in synchronization with the application of the gate-on voltage Von based on the data control signal CONT1.

Although not illustrated, when the display panel 100 is a liquid crystal panel, a backlight unit may be disposed behind the display panel 100, and at least one light source may be included. As an example of the light source, a fluorescent lamp such as a cold cathode fluorescent lamp ("CCFL"), a light emitting diode ("LED"), and the like may be included.

The signal controller 130 controls operations of the gate driver 120, the data driver 110, etc.

The signal controller 130 receives an input image signal IS and an input control signal CTRL. The input image signal IS includes luminance information of each pixel of the display panel 100, and the luminance may be classified into a predetermined number of grays, for example, 1024, 256, or 64. In an exemplary embodiment, the input control signal CTRL may include a vertical synchronization signal and a horizontal synchronizing signal that are related to image display, a main clock signal, a data enable signal, etc., for example.

The signal controller 130 appropriately processes the input image signal IS based on the input image signal IS and the input control signal CTRL to be suitable for the operating conditions of the display panel 100, and may generate the image data DATA, the data control signal CONT1, the gate control signal CONT2, and the like.

The signal controller 130 generates a frequency control signal DV by the input image signal IS and outputs the frequency control signal DV to the voltage-generating controller 140. The signal controller 130 may read a frequency division value corresponding to a pattern of the input image signal IS from a memory 132 to generate a frequency control signal DV. In this case, the memory 132 may be an electrically erasable programmable read-only memory ("EEPROM"), for example.

The voltage-generating controller 140 receives an input voltage VC to generate driving voltages Von and Voff, and AVDD, and supplies the driving voltages Von and Voff to the gate driver 120, and the driving voltage AVDD to the data driver 110. The voltage-generating controller 140 may be implemented as a switching regulator. A switching frequency of the voltage-generating controller 140 depends on a frequency control signal DV, and the driving voltages Von, Voff, and AVDD may be generated by a pulse width modulation ("PWM") method in a corresponding switching frequency condition.

Hereinafter, the signal controller 130 for generating the frequency control signal DV by the input image signal IS and the voltage-generating controller 140 for generating the driving voltages Von, Voff, and AVDD by the frequency control signal DV will be described in detail with reference to FIG. 2.

Figure 2:
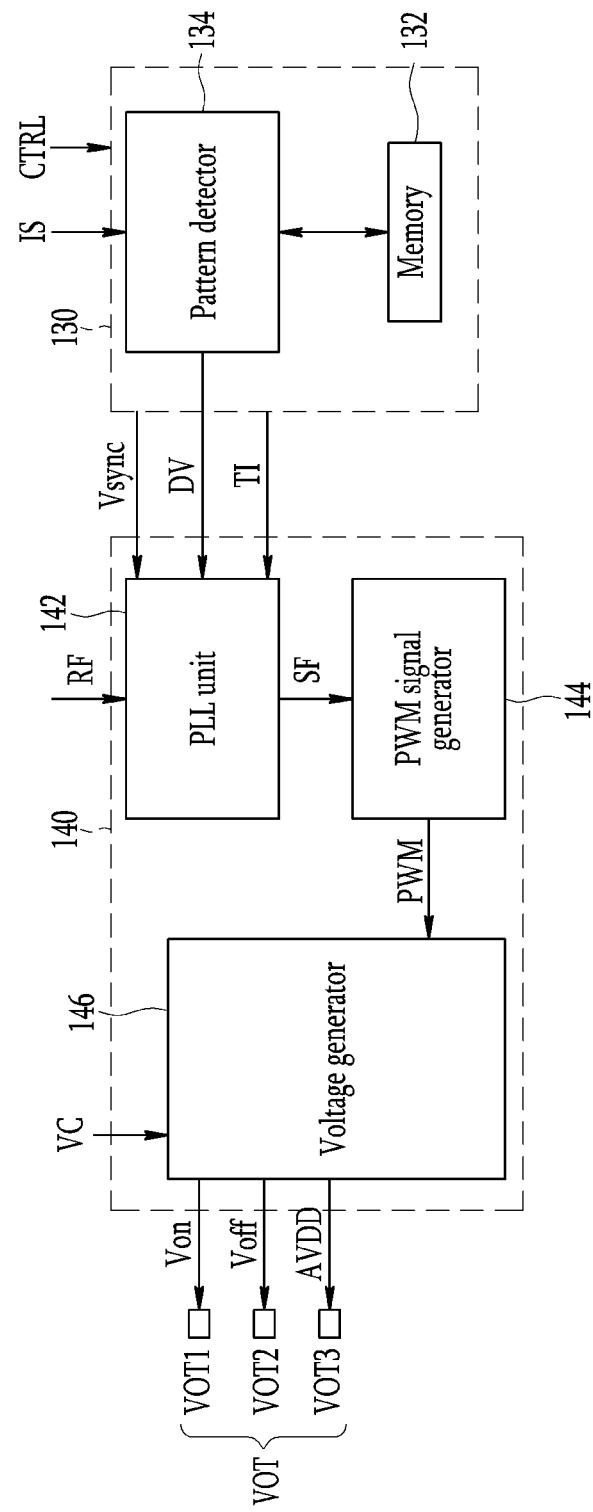
FIG. 2 is a block diagram illustrating an exemplary embodiment of some constituent elements of a display device.

FIG. 2 is a block diagram illustrating some constituent elements of a display device according to an exemplary embodiment. As described above, the signal controller 130 may include a pattern detector 134 and a memory 132, and the voltage-generating controller 140 may include a phase locked loop ("PLL") unit 142, a PWM signal generator 144, and a voltage generator 146.

First, the pattern detector 134 receives the input image signal IS. The pattern detector 134 detects a specific pattern in the input image signal IS, and transfers the frequency control signal DV corresponding to the detected specific pattern, to the voltage-generating controller 140. The specific pattern includes a pattern in which crosstalk occurs or a pattern in which a driving voltage ripple phenomenon may occur.

Specifically, the pattern detector 134 detects the number of data toggles in the input image signal IS of one frame. In an exemplary embodiment, the data driver 110 of the display panel 100 having a resolution of 3840*2160 includes four 960 channel data driver ICs, for example.

When a frame unit image is displayed during one vertical period, a minimum data toggle number of one data driving IC is 0 and a maximum data toggle number is 2073600 (=960*2160). As shown in Table 1 below, when a range of the minimum to maximum toggle number is divided into a plurality of ranges, a frequency division value corresponding to each divided range is stored in the memory 132.

TABLE 1

| Data Toggle number | Frequency division value |
| --- | --- |
| 0 | 1 |
| 0~500000 | 2 |
| 500001~1000000 | 3 |
| 1000001~1500000 | 4 |
| 1500001~2073600 | 5 |

The pattern detector 134 determines a range including the detected data toggle number. The pattern detector 134 reads the frequency division value corresponding to the determined range from the memory 132. The pattern detector 134 generates is the frequency control signal DV including the read frequency division value, and outputs the frequency control signal DV to the voltage-generating controller 140.

The signal controller 130 may supply a vertical synchronization signal Vsync included in an inputted control signal CTRL, to the voltage-generating controller 140. The signal controller 130 may supply timing information TI related to a time period (hereinafter also referred to as a first period) from a time point when the vertical synchronization signal Vsync rises to an enable level from a time point when a predetermined period elapses, to the voltage-generating controller 140. The elapsed time of the predetermined period may be a time point at which a scan start signal included in the gate control signal CONT2 is lowered to a disable level. In an alternative exemplary embodiment, the elapsed time of the predetermined period may be a time point after the time point at which the scan start signal included in the gate control signal CONT2 is lowered to the disable level.

Next, the PLL unit 142 of the voltage-generating controller 140 receives a reference signal RF which is switched to a reference frequency, the vertical synchronization signal Vsync, the frequency control signal DV, and the timing information TI.

The PLL unit 142 generates a switching frequency signal SF having a predetermined frequency by an inputted signal, and outputs it to the PWM signal generator 144.

The PWM signal generator 144 generates a PWM signal PWM at a frequency of the switching frequency signal SF, and outputs the PWM signal PWM to the voltage generator 146. The PWM signal generator 144 may modulate an on-pulse width of the PWM signal PWM to correspond to a magnitude of a desired driving voltage.

In an exemplary embodiment, the PLL unit 142 outputs the reference signal RF as the switching frequency signal SF during a first period, for example. The PWM signal generator 144 receives the reference signal RF as the switching frequency signal SF. The PWM signal generator 144 outputs the PWM signal PWM having the frequency of the reference signal RF to the voltage generator 146 during the first period.

In another exemplary, the PLL unit 142 generates the switching frequency signal SF by the reference signal RF and the frequency control signal DV during a second period except for the first period in one frame. The PLL unit 142 may generate the switching frequency signal SF by modulating the frequency of the reference signal RF. The PWM signal generator 144 outputs the PWM signal PWM having the frequency of the switching frequency signal SF to the voltage generator 146 during the second period.

Referring to Table 1, the PLL unit 142 may output the reference signal RF as the switching frequency signal SF when the frequency division value included in the frequency control signal DV is 5. The PLL unit 142 may output the switching frequency signal SF by modulating the frequency to have a smaller value than the frequency of the reference signal RF as the frequency division value included in the frequency control signal DV becomes smaller. In an exemplary embodiment, the PLL unit 142 may modulate the frequency of the switching frequency signal SF to 200 kilohertz (kHz) and output the switching frequency signal SF when the frequency of the reference signal RF is 800 kHz and the frequency division value included in the frequency control signal DV is 1, for example.

The PLL unit 142 may output a switching frequency signal SF having a high frequency when an image signal IS having a large number of data toggles is inputted, and may output a switching frequency signal SF having a low frequency when an image signal IS having a small number of data toggles is inputted.

As a result, when the number of data toggles increases, the data driver 110 operates as a higher load. When the data driver 110 operates as a high load, the PLL unit 142 may serve to modulate the frequency of the switching frequency signal SF such that a high-frequency PWM signal PWM is generated to suppress ripple generation.

When the number of data toggles decreases, the data driver 110 operates as a lower load. When the data driver 110 operates as a low load, the PLL unit 142 may serve to modulate the frequency of the switching frequency signal SF such that a low-frequency PWM signal PWM is generated to reduce power consumption and to ameliorate an electromagnetic interference ("EMI") characteristic.

Hereinafter, the PWM signal PWM and the switching frequency of the voltage-generating controller 140 according to an exemplary embodiment will be described with reference to FIGS. 3 and 4.

Figure 3:
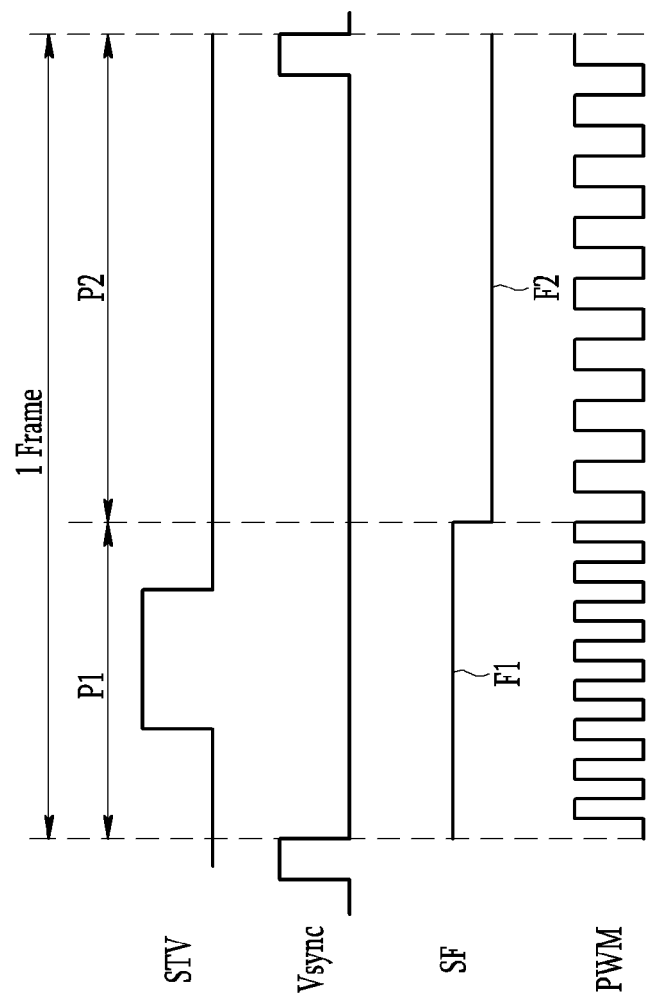
FIGS. 3 and 4 illustrate exemplary embodiments of pulse waveforms and switching frequencies of a converter.
Figure 4:
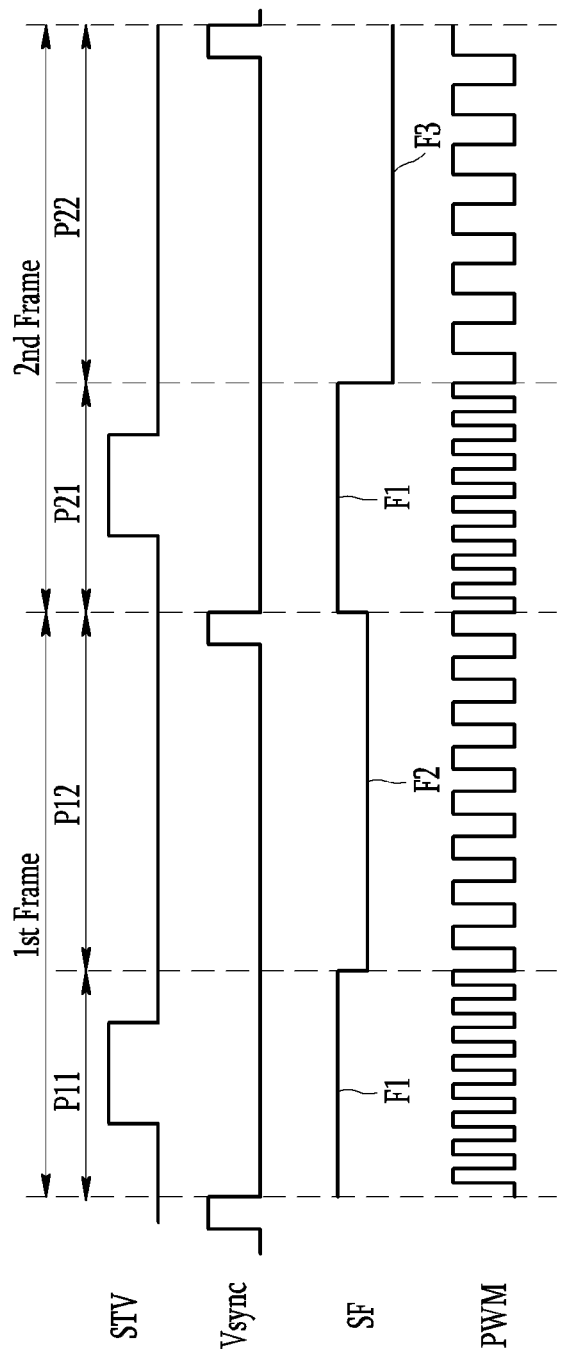

FIGS. 3 and 4 illustrate examples of pulse waveforms and switching frequencies of a converter according to an exemplary embodiment.

First, as shown in FIG. 3, the PLL unit 142 (refer to FIG. 2) may output the switching frequency signal SF having an F1 value which is the frequency of the reference signal RF (refer to FIG. 2) during the first period P1 of one frame period 1 Frame. The PLL unit 142 may output the switching frequency signal SF having an F2 value which is a modulated frequency during the second period P2 of one frame period 1 Frame. Thus, the PWM signal PWM in the first period P1 has a high frequency F1 and the PWM signal PWM in the second period P2 has a frequency F2 that is lower than that of F1.

The data driver 110 (refer to FIG. 1) and the gate driver 120 (refer to FIG. 1) are operated during the second period P2. The data driver 110 and the gate driver 120 which are operated may stop their operations at a falling edge of the vertical synchronization signal Vsync in the first period P1. The data driver 110 and the gate driver 120 which stop their operations may start their operations at a rising edge of the scan start signal STV in the first period P1.

As a result, the operations of the data driver 110 and the gate driver 120 may be stopped or started in the first period P1. A load condition of a voltage output terminal VOT (refer to FIG. 2) of the voltage-generating controller 140 (refer to FIGS. 1 and 2) may significantly vary at a time point at which the data driver 110 and the gate driver 120 stop or start their operations. As a result, a ripple may occur in the driving voltages AVDD, Von, and Voff outputted from the voltage-generating controller 140.

When the voltage-generating controller 140 generates the driving voltages AVDD, Von, and Voff by the high frequency PWM signal PWM, the voltage-generating controller 140 may output the driving voltages AVDD, Von, and Voff that are rectified within a short time even though a ripple occurs. Therefore, as the duration of the ripple is not long, the ripple maybe improved.

Next, as shown in FIG. 4, the PLL unit 142 (refer to FIG. 2) may output the switching frequency signal SF having a different frequency for each second period P12 and P22 of a frame period.

The PLL unit 142 outputs the switching frequency signal SF having a frequency F2 during the second period P12 of a first frame period 1st Frame, and outputs the switching frequency signal SF having a frequency F3 during the second period P22 of a second frame period 2nd Frame.

As a result, a value of the frequency control signal DV (refer to FIG. 2) is changed depending on a data toggle number of the image signal IS (refer to FIG. 2) for each frame, and thus the frequency of the switching frequency signal SF supplied to the PWM signal generator 144 may vary during the second period of each frame.

As a result, the PWM signal PWM in the second period P12 may be outputted at a higher frequency F2, and the PWM signal PWM in the second period P22 may be outputted at the frequency F3 that is lower than the frequency F2.

The voltage generator 146 generates the driving voltages AVDD, Von, and Voff (refer to FIG. 2) by the input voltage VC (refer to FIG. 2) and the PWM signal PWM, to respectively output the driving voltages AVDD, Von, and Voff to voltage output terminals VOT1, VOT2 and VOT3 connected with the data driver 110 and the gate driver 120, respectively. The voltage generator 146 may generate the driving voltages AVDD, Von, and Voff by stepping an input voltage VC up or down according to the PWM signal PWM.

When a number of times the load condition of the data driver 110 to which the analog driving voltage AVDD is supplied varies by the data toggle increases, the voltage generator 146 may generate an analog driving voltage AVDD according to the PWM signal PWM having a higher switching frequency. Then, the voltage-generating controller 140 according to the illustrated exemplary embodiment may suppress ripple generation by data toggling.

The data driver 110 and the gate driver 120 are operated during the second periods P2, P12, and P22, and the data driver 110 and the gate driver 120 stop or start their operations during the first periods P1, P11, and P21. Accordingly, a fluctuation width of the load condition of a voltage output terminal VOT of the voltage-generating controller 140 is significantly increased.

The voltage-generating controller 140 of the display device according to the illustrated exemplary embodiment generates the driving voltages AVDD, Von, and Voff according to the PWM signal PWM having a highest switching frequency to correspond to the first periods P1, P11, and P21 of each frame.

As a result, when the first periods P1, P11, and P21 start, the frequency of the PWM signal PWM of the voltage generation control section 140 may be increased to suppress the occurrence of ripple. Thus, an image display quality may be improved.

During the second periods P2, P12, and P22, the image signal IS displayed on the display panel 100 may be changed. Depending on a data toggle number of the image signal IS, a load condition of a voltage output terminal VOT of the voltage-generating controller 140 connected with the data driver 110 may vary.

The voltage-generating controller 140 of the display device according to the illustrated exemplary embodiment may detect the data toggle number of the image signal IS to vary the frequency of the PWM signal PWM. Therefore, since the PWM signal PWM of which a frequency is changed in response to a degree to which the load condition is fluctuated is generated, the occurrence of ripple according to the degree of fluctuation of the high load condition may be reduced. In addition, it is possible to reduce the frequency of the PWM signal PWM in response to low load condition fluctuation information, thereby reducing power consumption of the display device 10 (refer to FIG. 1), improving EMI characteristics, and alleviating thermal stress.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A display device comprising:
   a display panel which includes a plurality of pixels, a plurality of data lines, and a plurality of gate lines;
   a data driver which supplies data signals to the plurality of data lines;
   a gate driver which supplies gate signals to the plurality of gate lines;
   a voltage-generating controller which generates a driving voltage of the data driver and a driving voltage of the gate driver by modulating an input voltage in response to a pulse width modulation signal; and
   a signal controller which controls a frequency of the pulse width modulation signal to a first frequency during a first period of one frame period, and controls the frequency of the pulse width modulation signal to a second frequency corresponding to a pattern of an image signal during a second period other than the first period of the one frame period,
   wherein the voltage-generating controller includes:
   a phase locked loop unit which outputs a first frequency signal having the first frequency during the first period and outputs a second frequency signal having the second frequency during the second period;
   a pulse width modulation signal generator which generates the pulse width modulation signal according to the first frequency signal or the second frequency signal; and
   a voltage generator which outputs a driving voltage obtained by modulating an input voltage in response to the pulse width modulation signal.

2. The display device of claim 1, wherein the signal controller transmits a vertical synchronization signal and information related to a predetermined time period after a time when the vertical synchronization signal is changed to a disable level, to the voltage-generating controller.

3. The display device of claim 2, wherein the phase locked loop unit determines the first period and the second period by receiving the vertical synchronization signal and the information related to the predetermined time period.

4. The display device of claim 1, wherein the gate driver and the data driver start their operations during the first period.

5. The display device of claim 1, wherein the gate driver and the data driver stop their operations during the first period.

6. The display device of claim 1, wherein the signal controller detects a data toggle number in an image signal of the one frame period, and increases the second frequency when the data toggle number is increased.

7. The display device of claim 4, wherein the second frequency is equal to or smaller than the first frequency.

8. The display device of claim 1, wherein the data driver generates a data signal of the data signals by a reference gamma voltage generated by dividing a driving voltage of the data driver.

9. The display device of claim 1, wherein the driving voltage of the data driver includes a gate-on voltage and a gate-off voltage, and
   the gate driver outputs a gate signal of the gate signals generated by a combination of the gate-on voltage and the gate-off voltage.

* * * * *